United States Patent
Jiang et al.

(10) Patent No.: US 12,387,794 B2
(45) Date of Patent: Aug. 12, 2025

(54) METHODS FOR PROGRAMMING A MEMORY DEVICE, MEMORY DEVICES, AND MEMORY SYSTEMS

(71) Applicant: YANGTZE MEMORY TECHNOLOGIES CO., LTD., Wuhan (CN)

(72) Inventors: Ke Jiang, Wuhan (CN); Xiaodong Mei, Wuhan (CN); Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 315 days.

(21) Appl. No.: 18/090,402

(22) Filed: Dec. 28, 2022

(65) Prior Publication Data

US 2023/0143677 A1 May 11, 2023

Related U.S. Application Data

(63) Continuation of application No. PCT/CN2021/115848, filed on Aug. 31, 2021.

(51) Int. Cl.
  *G11C 7/00* (2006.01)
  *G11C 16/12* (2006.01)
  *G11C 16/34* (2006.01)

(52) U.S. Cl.
  CPC .......... *G11C 16/12* (2013.01); *G11C 16/3459* (2013.01)

(58) Field of Classification Search
  CPC ............................ G11C 16/12; G11C 16/3459
  USPC .................................................. 365/189.011
  See application file for complete search history.

(56) References Cited

U.S. PATENT DOCUMENTS

| | | | | |
|---|---|---|---|---|
| 8,351,262 B2* | 1/2013 | Park | ................... | G11C 16/0483 365/185.11 |
| 8,508,998 B2* | 8/2013 | Haukness | ........... | G06F 12/0246 365/185.11 |
| 9,202,576 B2* | 12/2015 | Shereshevski | ...... | G11C 11/5628 |
| 9,524,773 B2* | 12/2016 | Lee | ................... | G11C 16/3459 |
| 9,570,160 B1* | 2/2017 | Shah | ..................... | G11C 29/08 |

(Continued)

FOREIGN PATENT DOCUMENTS

| CN | 111615731 A | 9/2020 |
|---|---|---|
| CN | 112927741 A | 6/2021 |

(Continued)

OTHER PUBLICATIONS

Notice of Reasons for Reusal issued in corresponding Japanese Application No. 2023-538725, mailed on May 7, 2024, 7 pages.

*Primary Examiner* — Viet Q Nguyen
(74) *Attorney, Agent, or Firm* — BAYES PLLC

(57) ABSTRACT

A method for programming a memory device, a memory device, and a memory system are disclosed. The memory device includes planes. The method includes: programming the planes by using a programming voltage incremented with a first step size; verifying the planes, and in response to determining that one or more planes are with a verification exception, disabling the one or more planes with the verification exception; and in response to the one or more planes with the verification exception being disabled, programming remaining one or more planes that are not disabled by using an other programming voltage incremented with a second step size less than the first step size.

20 Claims, 6 Drawing Sheets

(56) References Cited

U.S. PATENT DOCUMENTS

| | | | |
|---|---|---|---|
| 9,595,343 B1* | 3/2017 | Srinivasan | G11C 16/3459 |
| 9,666,286 B2* | 5/2017 | Lee | G11C 16/26 |
| 11,133,077 B2* | 9/2021 | Deng | G11C 16/26 |
| 11,139,029 B2* | 10/2021 | Li | G11C 16/24 |
| 11,348,643 B2* | 5/2022 | Sagron | G11C 16/26 |
| 11,398,277 B2* | 7/2022 | Kusaka | G11C 16/08 |
| 11,514,991 B1* | 11/2022 | Wu | G11C 11/5628 |
| 11,514,992 B2* | 11/2022 | Zuolo | G06N 5/04 |
| 11,538,538 B1* | 12/2022 | Tian | G11C 16/3481 |
| 11,605,436 B2* | 3/2023 | Chin | G11C 16/0483 |
| 11,615,849 B2* | 3/2023 | Li | G11C 16/3427 |
| | | | 365/185.22 |
| 11,657,883 B2* | 5/2023 | Zhang | G11C 11/5635 |
| | | | 365/185.22 |
| 11,688,472 B2* | 6/2023 | Kang | G11C 16/10 |
| | | | 365/185.22 |
| 12,026,514 B1* | 7/2024 | Zhang | G06F 9/3013 |
| 2009/0244983 A1* | 10/2009 | Park | G11C 16/3427 |
| | | | 365/185.11 |
| 2018/0203774 A1* | 7/2018 | Srinivasan | G11C 16/3459 |
| 2019/0214100 A1* | 7/2019 | Puthenthermadam | G11C 16/3427 |
| 2021/0264994 A1* | 8/2021 | Deng | G11C 11/5628 |
| 2021/0294503 A1* | 9/2021 | Lee | G06F 3/0655 |
| 2023/0023618 A1* | 1/2023 | Zhang | G11C 16/30 |
| 2023/0148416 A1* | 5/2023 | Guo | G11C 11/5628 |
| | | | 365/189.011 |

FOREIGN PATENT DOCUMENTS

| | | |
|---|---|---|
| CN | 112965667 A | 6/2021 |
| JP | 2008544435 A | 12/2008 |
| WO | 2021/072728 A1 | 4/2021 |
| WO | 2021/163945 A1 | 8/2021 |

\* cited by examiner

METHODS FOR PROGRAMMING A MEMORY DEVICE, MEMORY DEVICES, AND MEMORY SYSTEMS

CROSS REFERENCE TO RELATED APPLICATIONS

This application is a continuation of International Application No. PCT/CN2021/115848, filed on Aug. 31, 2021, the disclosure of which is hereby incorporated by reference in its entirety.

TECHNICAL FIELD

The present disclosure relates to the technical field of semiconductors, and particularly to a method for programming a memory device, a memory device, and a memory system.

BACKGROUND

Non-volatile memory has been widely used in personal computers, telecommunications, consumer electronics and other fields. Electrically erasable programmable read-only memory (EEPROM) and flash memory are among the most widely used non-volatile memories.

According to structural configurations of memory arrays, memory devices may be classified into a single-plane type and a multi-plane type. A single-plane type memory device includes a memory array arranged in a single plane, and a multi-plane type memory device includes a memory array arranged in multiple planes. During programming of a multi-plane type memory device, two or more planes may be programmed simultaneously to increase programming efficiency. This programming mode of programming two or more planes simultaneously is referred to as multi-plane programming.

SUMMARY

According to a first aspect, an implementation of the present disclosure provides a method for programming a memory device including planes, the method including: programming at least two of the planes by using a programming voltage incremented with a first step size; verifying the at least two planes, and in response to determining that the at least two planes include at least one plane with a verification exception, disabling the at least one plane with the verification exception; and in response to the at least one plane in the at least two planes being disabled, programming at least one of the at least two planes that is not disabled by using another programming voltage incremented with a second step size; where the second step size is less than the first step size.

According to a second aspect, an implementation of the present disclosure provides a memory device, including: a memory array including planes; a row driver, configured to apply a programming voltage incremented with a first step size to at least two of the planes; and a control logic circuit, configured to verify the at least two planes, and in response to determining that the at least two planes include at least one plane with a verification exception, disable the at least one plane with the verification exception, where the row driver is further configured to, in response to the at least one plane in the at least two planes being disabled, program at least one of the at least two planes that is not disabled by using another programming voltage incremented with a second step size; where the second step size is less than the first step size.

According to a third aspect, an implementation of the present disclosure provides a memory system, including: one or more memory devices according to any one of the second aspect; and a memory controller coupled to the memory device.

BRIEF DESCRIPTION OF THE DRAWINGS

In the drawings, same reference numerals refer to the same or similar components or elements throughout a plurality of drawings unless otherwise specified. These drawings are not necessarily drawn to scale. It should be understood that these drawings only depict some implementations disclosed in accordance with the present disclosure and should not be considered as limiting the scope of the present disclosure.

DETAILED DESCRIPTION

Figure 1:
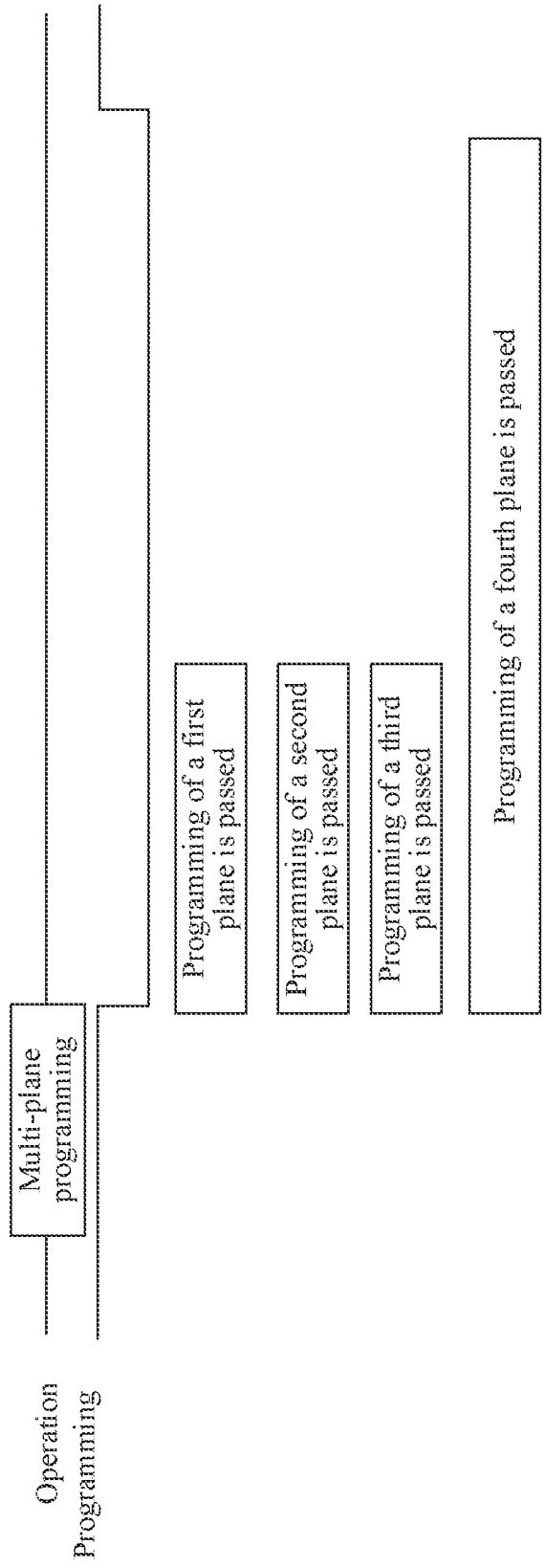
FIG. 1 is a schematic timing diagram of multi-plane programming according to an implementation of the present disclosure.

Exemplary implementations disclosed herein will be described in more detail below with reference to the drawings. Although the exemplary implementations of the present disclosure are illustrated in the drawings, it should be understood that the present disclosure may be implemented in various forms without being limited by the specific implementations set forth herein. In contrast, these implementations are provided to enable a more thorough understanding of the present disclosure and to enable the full scope of the disclosure of the present disclosure to be communicated to those skilled in the art.

In the following description, a number of specific details are given to provide a more thorough understanding of the present disclosure. However, it will be apparent to those skilled in the art that the present disclosure may be implemented without one or more of these details. In other examples, some technical features known in the art are not described to avoid confusion with the present disclosure. That is, all features of the actual implementation are not described herein, and well-known functions and structures are not described in detail.

Further, the drawings are merely schematic illustrations of the present disclosure and are not necessarily drawn to scale. Same reference numerals in the drawings denote the same or similar parts, and thus repeated descriptions thereof will be omitted. Some of the block diagrams shown in the drawings are functional entities that do not necessarily correspond to physically or logically independent entities. The functional entities may be implemented in software form, or in one or more hardware modules or integrated circuits, or in different network and/or processor devices and/or microcontroller devices.

The flowcharts shown in the drawings are illustrative only and do not necessarily include all the operations. For example, some of the operations may also be decomposed and some may be combined or partially combined, so that the order of actual execution may vary depending on the actual situation.

The term used herein is merely intended to describe specific implementations and is not intended as a limitation of the present disclosure. When used herein, the singular forms "a," "an" and "the/said" are also intended to include plural forms, unless the context clearly dictates otherwise. It should also be understood that the terms "composition" and/or "including," when used in the description, the presence of the features, integers, steps, operations, elements and/or components is determined, but the presence or addition of one or more other features, integers, steps, operations, elements, components and/or groups is not excluded. As used herein, the term "and/or" includes any and all combinations of the related listed items.

For more precise control of the threshold voltage distribution of the programmed memory cells, an incremental step pulse programming (ISPP) mode is often used. In the ISPP mode, a programming voltage applied to the word line incrementally rises during a programming cycle. The programming voltage is incremented with a predetermined step size ($\Delta V$), which is also referred to as "a rising rate." In the programming sequence, the cell threshold voltage of the programmed memory cell increases at a rate predetermined for each programming cycle. Non-volatile memory devices are programmed, and each programming cycle typically includes a programming period and a programming verification period. During the programming period, selected memory cells are programmed under a given bias condition, and a programming voltage is applied to the corresponding word lines of the selected memory cells. During the programming verification period, the programmed memory cells are verified to determine whether the programmed memory cells reach the condition of the target threshold voltage. The programming verification operation is similar to a read operation except that the read data is not output to the outside of the device.

In an implementation of the present disclosure, during the ISPP programming process, after applying each programming voltage, the threshold voltage Vth of some memory cells is greater than the verification voltage Vverify, while the threshold voltage Vth of other memory cells is still less than the verification voltage Vverify. After increasing the programming voltage for a plurality of times and performing the programming operation, the threshold voltage Vth of all memory cells within the setting is finally greater than the verification voltage Vverify, thereby completing the programming process.

In the verification operation, a verification voltage Vverify is applied to the word lines corresponding to the programmed memory cells in order to verify whether each programmed memory cell reaches its target threshold voltage. If negative, the selected memory cell may be verified as failed, and if positive, the selected memory cell may be verified as passed.

FIG. 1 is a schematic timing diagram of multi-plane programming according to an implementation of the present disclosure. As shown in FIG. 1, when the multi-plane programming is performed, the programming speed is determined by a slowest plane that passes the programming process. Therefore, when the programming speed of the slowest plane (e.g., $4^{th}$ plane as shown in FIG. 1) is much lower than those of other planes (e.g., $1^{st}$ $2^{nd}$ and $3^{rd}$ planes as shown in FIG. 1), the other planes may suffer neighbor plane disturb (NPD).

Figure 2:
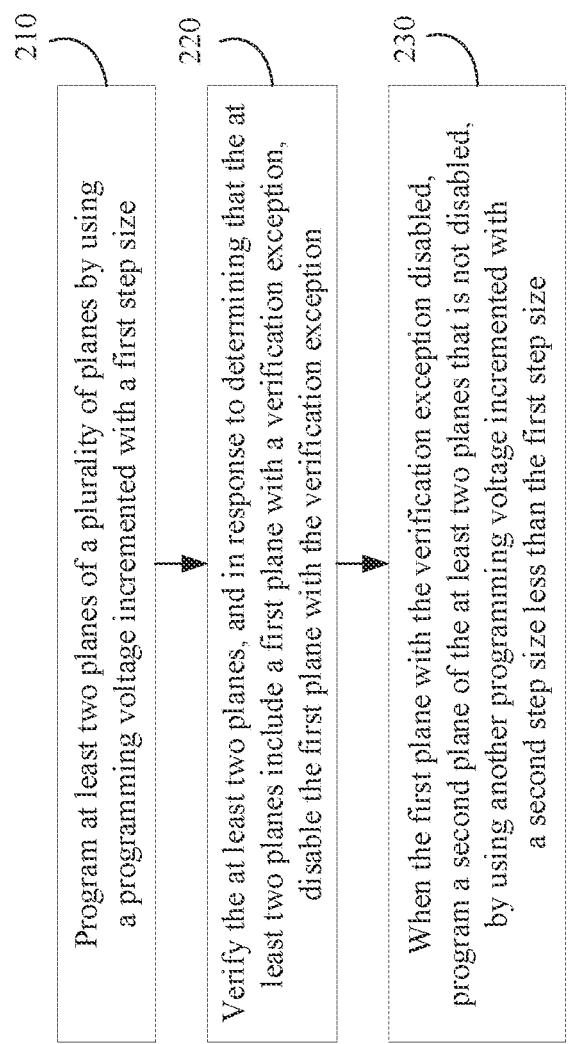
FIG. 2 is a first schematic flowchart of a method for programming a memory device according to an implementation of the present disclosure.

Accordingly, the present disclosure proposes the following implementations. An implementation of the present disclosure provides a method for programming a memory device. FIG. 2 is a first schematic flowchart of a method for programming a memory device according to an implementation of the present disclosure. The memory device includes a plurality of planes. As shown in FIG. 2, the method includes the following operations:

At 210, at least two planes of a plurality of planes are programmed by using a programming voltage incremented with a first step size.

At 220, the at least two planes are verified, and in response to determining that the at least two planes include a first plane with a verification exception, the first plane with the verification exception is disabled.

At 230, when the first plane with the verification exception is disabled, a second plane of the at least two planes that is not disabled is programmed by using another programming voltage incremented with a second step size less than the first step size.

In an implementation of the present disclosure, the memory cells may be of a Single-Level Cell (SLC) type, a Multi-Level Cell (MLC) type, a Trinary-Level Cell (TLC) type, a Quad-Level Cell (QLC) type, a Penta-Level Cell (PLC) type or a higher-level type. Each SLC may store one-bit data, each MLC may store two-bit data, each TLC may store three-bit data, each QLC may store four-bit data, and each PLC may store five-bit data. Each memory cell may maintain one of Q possible data states, where Q is a positive integer equal to or greater than two. For example, for a SLC, Q=2; for a MLC, Q=4; for a TLC, Q=8; for a QLC, Q=16; and for a PLC, Q=32. The Q possible data states may include an erase state S(0) and programming states S(1) to S(Q−1), where the programming state S(1) is a lowest programming state and the programming state S(Q−1) is a highest programming state. In one example, a TLC may be programmed to one of eight possible data states, where programming state S(1) is the lowest programming state and programming state S(7) is the highest programming state.

The memory cells may be initially set to erase state S(0), and then a series of programming operations and verification operations may be performed to the memory cells to program each memory cell to a corresponding target programming state. The series of programming operations and verification operations may begin with the lowest programming state S(1) and then proceed to higher programming state(s) until the threshold voltage Vth of the selected memory cell reaches the corresponding verification voltage level of the corresponding target programming state. In some implementations, the minimum threshold voltages of the threshold voltage distribution curves of the programming states S(1) to S(Q−1) may be used as the verification voltages of the programming states S(1) to S(Q−1), respectively. Each programming cycle may include a programming operation and a subsequent verification operation. In the programming operation, some of the memory cells may be selected and programmed into the programming states in a row-by-row manner from the first row to the $N^{th}$ row, or from the $N^{th}$ row to the first row. In a subsequent verification operation, it may be verified whether the selected memory cells have reached the corresponding target programming states in a row-by-row manner from the first row to the $N^{th}$ row or from the $N^{th}$ row to the first row. In this manner, the selected memory cells can be programmed into the corresponding target programming states.

In an implementation of the present disclosure, the multi-plane programming method for four planes is used as an example. It should be noted that the number of planes included in the memory device may be greater than or equal to 4.

In an implementation of the present disclosure, the second step size $\Delta V2$ may be determined according to the number of disabled planes. Specifically, the four planes are programmed by using a programming voltage incremented with a first step size $\Delta V1$. A programming verification operation is performed on each plane after programming, and in response to determining that the four planes include one (or more) plane(s) with a verification exception, the one (or more) plane(s) with the verification exception is (are) disabled. After that, the second step size $\Delta V2$ may be determined according to the number of the disabled planes. In some implementations, the second step size is a second value when the number of the disabled planes is a first value; and the second step size is a fourth value when the number of the disabled planes is a third value. The third value is greater than the first value, and correspondingly, the fourth value is less than the second value. For example, when the number of the disabled plane is 1, the second step size $\Delta V2$ may be about 0.15 volt (V); when the number of the disabled planes is 2, the second step size $\Delta V2$ may be about 0.1 V; when the number of the disabled planes is 3, the second step size $\Delta V2$ may be about 0.05 V. That is, the second step size $\Delta V2$ may decrease as the number of the disabled planes increases.

A specific process of programming four planes by using the programming voltage incremented with the first step size $\Delta V1$ is described by the following: the four planes are set to an initial programming voltage Vi, and then the initial programming voltage Vi is incremented with the first step size $\Delta V1$, that is, the four planes are incrementally programmed by using Vi+n$\Delta V1$, wherein number n is increased one by one until each selected memory cell in the four planes reaches a predetermined programming state or a target programming state. It should be noted that in the process of programming the four planes by using the programming voltage incremented with the first step size $\Delta V1$, a verification operation may be performed after each programming voltage is applied each time, or a verification operation may be performed after the programming voltages are applied every Z times. Z is greater than or equal to 2.

In an implementation of the present disclosure, each of the at least two planes is verified, to verify whether the plane reaches a predetermined programming state. It is determined that the at least two planes include a plane with the verification exception, when the plane has been verified for a predetermined number of times and does not reach the predetermined programming state. The predetermined number of times herein is a maximum failure count corresponding to the predetermined programming state. A failure count is a count of the number of failed plane verifications.

In an implementation of the present disclosure, for each of the planes, when the plane has not been verified for a predetermined number of times and does not reach the predetermined programming state, the number of verification times is incremented.

In an implementation of the present disclosure, each of the planes includes a plurality of memory cells arranged in rows and columns. A pass voltage incremented with a third step size $\Delta V3$ is applied to a plurality of unselected memory cells in at least two of the plurality of planes, when programming the plurality of selected memory cells in the four planes by using a programming voltage incremented with a first step size $\Delta V1$. For example, during programming to a predetermined programming state S(q), an initial programming voltage Vpgm1 is applied to a plurality of selected memory cells in four planes while an initial pass voltage Vpass1 is applied to a plurality of unselected memory cells in four planes. After the verification operation is performed, the programming operation is continued to be performed on the memory cells whose verification fail (the predetermined programming state S(q) is not reached). A second programming voltage Vpgm2=Vpgm1+$\Delta V1$ is applied to a plurality of memory cells that do not reach the predetermined programming state S(q) in the four planes while a second pass voltage Vpass2=Vpass1+$\Delta V3$ is applied to a plurality of unselected memory cells in the four planes; until the plurality of selected memory cells in the four planes reach the predetermined programming state S(q) or the four planes include a plane with a verification exception. Herein, the initial programming voltage Vpgm1 and the initial pass voltage Vpass1 are the initial programming voltage and the initial pass voltage corresponding to the predetermined programming state S(q) respectively.

In an implementation of the present disclosure, when the four planes include a disabled plane, a pass voltage incremented with a fourth step size $\Delta V4$ is applied to a plurality of unselected memory cells in the plane that is not disabled, when programming the plane that is not disabled by using the programming voltages incremented with the second step size $\Delta V2$. The fourth step size $\Delta V4$ is less than the third step size $\Delta V3$. Here, the plane that is not disabled is a plane that reaches the predetermined programming state S(q). At this time, if the predetermined programming state S(q) is not the target programming state, the predetermined programming state S(q) is set to the next programming state S(q+1). For example, during programming to the predetermined programming state S(q+1), an initial programming voltage Vpgm1 is applied to a plurality of selected memory cells in the plane that is not disabled while an initial pass voltage Vpass1 is applied to a plurality of unselected memory cells in a plane that is not disabled. After the verification operation is performed, the programming operation is continued to be performed on the memory cells whose verification fail (the predetermined programming state is not reached). A second programming voltage Vpgm2=Vpgm1+$\Delta V2$ is applied to a plurality of memory cells that do not reach the predetermined programming state S(q+1) in the plane that is not disabled while a second pass voltage Vpass2=Vpass1+$\Delta V4$ is applied to a plurality of unselected memory cells in the plane that is not disabled; . . . until the plurality of selected memory cells in the plane that is not disabled reach a predetermined programming state S(q+1) or a plane with the verification exception occurs in the plane that is not disabled. Here, the initial programming voltage Vpgm1 and the initial pass voltage Vpass1 are the initial programming voltage and the initial pass voltage corresponding to the predetermined programming state S(q+1) respectively.

In an implementation of the present disclosure, for each plane, it is verified whether the plurality of selected memory cells have reached the predetermined programming state. If there are more than a preset number of the plurality of selected memory cells that fail to reach the predetermined programming state, the plane verification fails. If there are less than a preset number of the plurality of selected memory cells that fail to reach the predetermined programming state, the plane verification is passed.

In an implementation of the present disclosure, the first step size is in a range of about 0.15 V to about 0.5 V, and the second step size is in a range of about 0.1 V to about 0.45 V. In one implementation of the present disclosure, the first step size is approximately 0.1 V higher than the second step size. In another implementation, the difference between the first step size and the second step size is about 0.07 V. In yet another implementation, the difference between the first step size and the second step size is about 0.13 V, about 0.15 V, or about 0.18 V.

In an implementation of the present disclosure, the programming operation of the at least two planes is terminated when both/all of the at least two planes are disabled. For example, when all four planes are disabled, the multi-plane programming of the four planes is exited.

Figure 3:
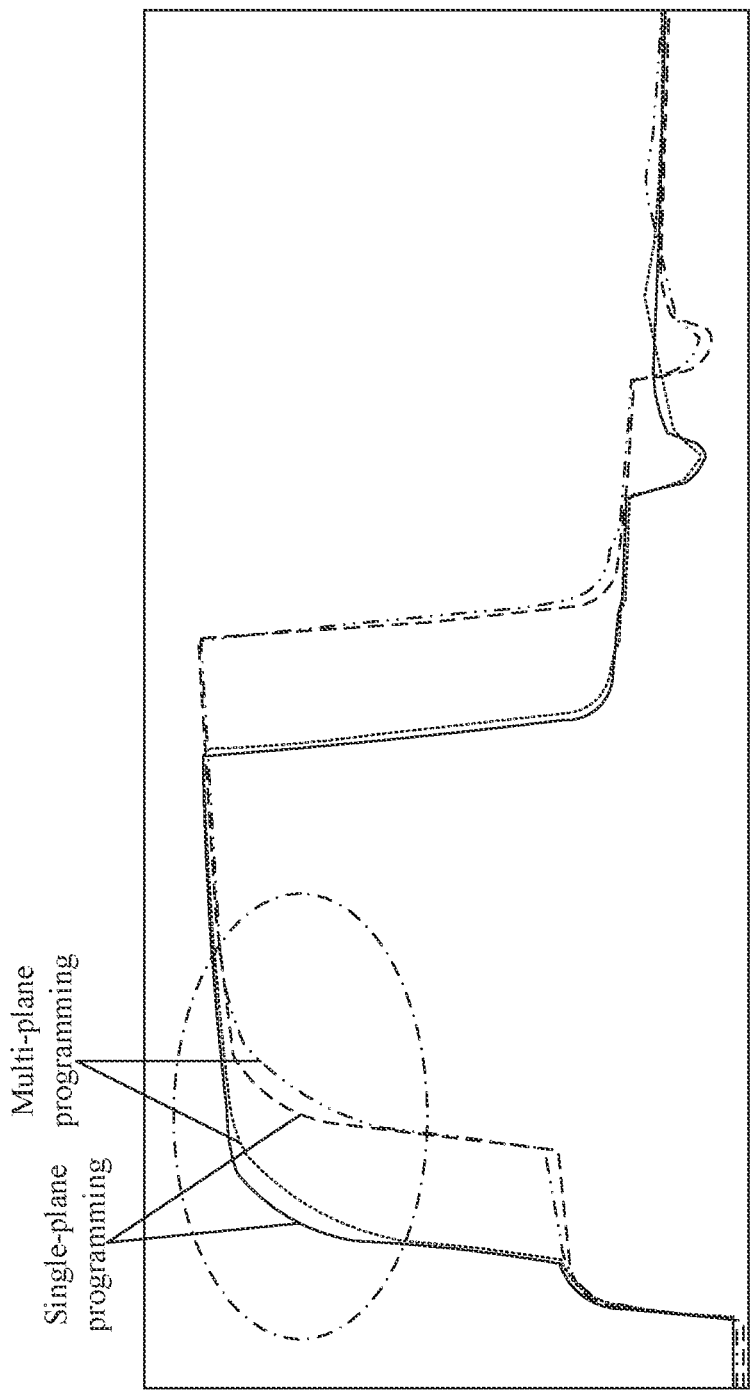
FIG. 3 is a programming voltage timing diagram of single-plane programming and multi-plane programming according to an implementation of the present disclosure.

FIG. 3 is a programming voltage timing diagram of single-plane programming and multi-plane programming according to an implementation of the present disclosure. The abscissa denotes time, and the ordinate denotes voltage. As can be seen from analysis of the programming process in FIG. 3, the change speed of the programming voltage Vpgm in the single-plane programming mode is faster, that is, the charging time of the programming voltage Vpgm in the single-plane programming mode is less than the charging time of the programming voltage Vpgm in the multi-plane programming mode. Accordingly, with the same programming voltage Vpgm, the holding time of the programming voltage Vpgm in the multi-plane programming mode is less than the holding time of the programming voltage Vpgm in the single-plane programming mode. In other words, the multi-plane programming requires a longer charging time than single-plane program. Based on this, in the multi-plane programming mode, when a plane is disabled (that is, the number of the to-be-programmed plane is reduced), the charging time of the programming voltage Vpgm of the plane that continues to be programmed subsequently is reduced, and the holding time thereof is increased, thereby causing the programming time to be increased. Therefore, at this time, the step size of the programming voltage is reduced (the programming voltage is reduced) to balance the charging time and the holding time of the programming voltage Vpgm of the plane, thereby the overall programming time is controlled and the programming efficiency is improved.

Figure 4:
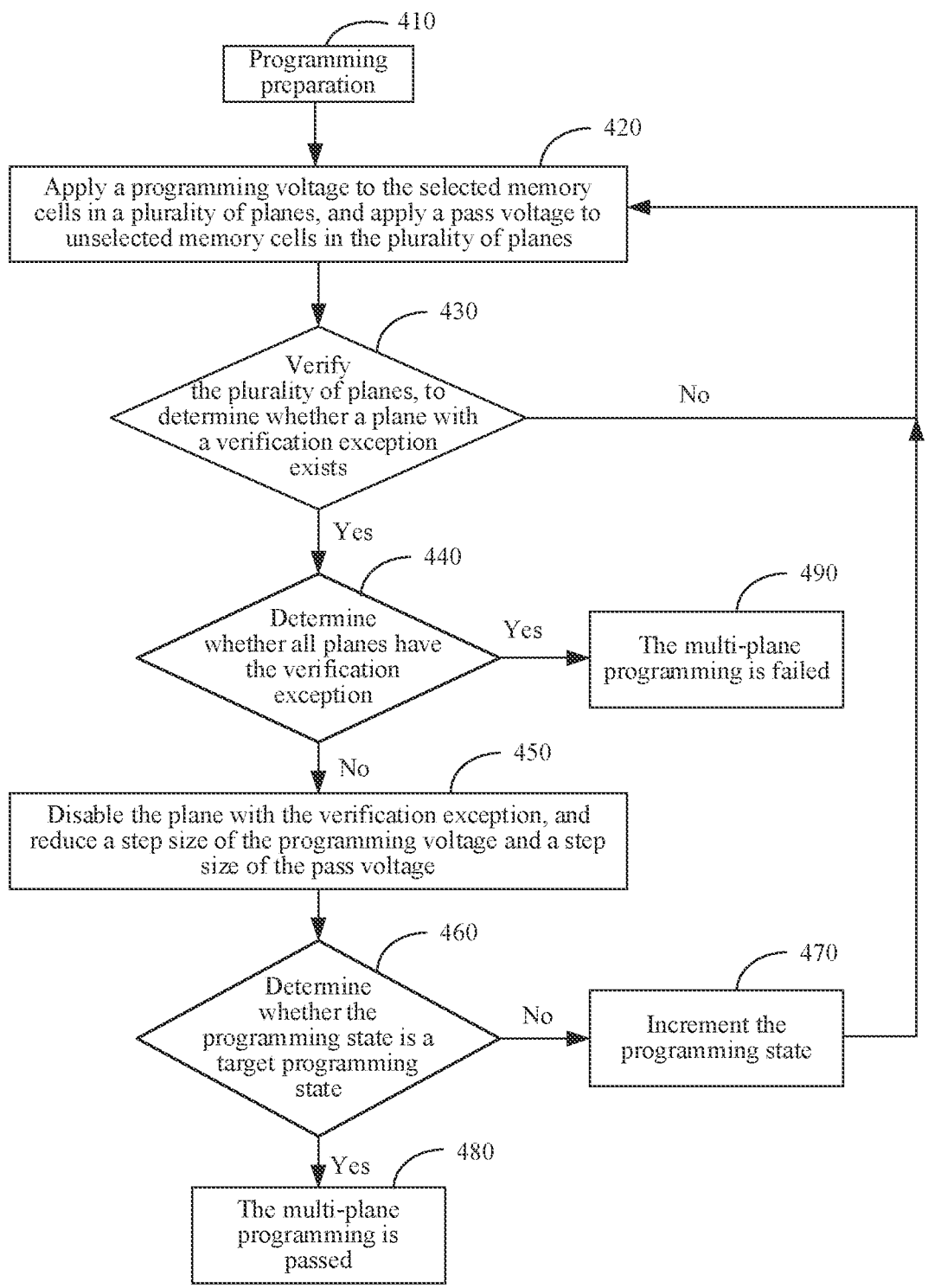
FIG. 4 is a second schematic flowchart of a method for programming a memory device according to an implementation of the present disclosure.

FIG. 4 is a second schematic flowchart of a method for programming a memory device according to an implementation of the present disclosure. As shown in FIG. 4, the method includes the following operations.

At 410, programming preparation is performed.

At 420, a programming voltage is applied to selected memory cells in a plurality of planes, and a pass voltage is applied to unselected memory cells in the plurality of planes.

At 430, the plurality of planes are verified, and it is determined whether a plane with the verification exception exists; if yes, step 440 is performed; if not, step 420 is performed.

At 440, it is determined whether all planes have the verification exceptions; if yes, step 490 is performed; if not, step 450 is performed.

At 450, the plane with the verification exception is disabled, and the step sizes of the programming voltage and the pass voltage are reduced.

At 460: it is determined whether the programming state is a target programming state; if not, step 470 is performed; if yes, step 480 is performed.

At 470: the programming state is incremented, and step 420 is performed on the plane that is not disabled.

At 480: the multi-plane programming is passed.

At 490: the multi-plane programming is failed.

In an implementation of the present disclosure, for example, the multi-plane programming is performed on four planes, and the memory cells are TLC memory cells. In the multi-plane programming, four planes in the memory device are programmed. A programming voltage is applied to a plurality of selected memory cells in the four planes, and a pass voltage is applied to a plurality of unselected memory cells in the four planes.

The selected memory cells in the four planes are verified to verify whether the selected memory cells in the four planes reach the predetermined programming state S(1). If there are more than a predetermined number of the memory cells that fail to reach the predetermined programming state S(1), the plane verification fails. If there are less than a predetermined number of memory cells that fail to reach the predetermined programming state S(1), the plane verification is passed.

If the plane verification fails, it is then determined whether the verification failure count is less than the maximum failure count (predetermined number of times) of the programming state S(1). In some implementations, the maximum failure count may be 4. If the verification failure count is less than the maximum failure count, the verification failure count is incremented by 1. When the verification failure count is not less than the maximum failure count, it is determined that the four planes include a plane with a verification exception, at this time, the plane with the verification exception is disabled, and the step sizes of the programming voltage and the pass voltage are reduced.

For the plane that is not disabled, it is determined whether a programming state thereof is a target programming state. If the programming state is not the target programming state, the programming state is incremented, that is, the programming state is incremented to S(2). The plane that is not disabled is programmed in programming state S(2) with the step sizes of reduced programming voltage and pass voltage. Here, if the step sizes of the programming voltage and the pass voltage in the programming process of the programming state S(1) are the first step size and the third step size, respectively, and the step sizes of the programming voltage and the pass voltage in the programming process of the programming state S(2) are the second step size and the fourth step size, respectively, then the second step size is less than the first step size, and the fourth step size is less than the third step size.

Here, the programming process of the programming state S(2) is similar to the programming process of the programming state S(1), and thus will not be described again. If the plane with a verification exception is included during programming of the programming state S(2), the plane with the verification exception is continued to be disabled and the step sizes of the programming voltage and the pass voltage are continued to be reduced. The programming state is incremented to S(3). The plane that is not disabled is programmed to programming state S(3) with the step sizes of the programming voltage and the pass voltage that have been reduced again. Here, if the step sizes of the programming voltage and the pass voltage in the programming process of the programming state S(2) are the second step size and the fourth step size, respectively, and the step sizes of the programming voltage and the pass voltage in the programming process of the programming state S(3) are the fifth step size and the sixth step size, respectively; then the fifth step size is less than the second step size, and the sixth step size is less than the fourth step size.

When the programming state S(3) is the target programming state, the multi-plane programming is passed and the multi-plane programming is exited. It should be noted that during the process of the multi-plane programming, only the plane without the verification exception (not disabled) has been programmed.

It should be noted that in the above process, if all the planes have verification exceptions, the multi-plane programming is failed and the multi-plane programming is exited.

In some implementations, the control logic circuit may generate a status report for indicating the result of programming upon exiting the programming cycle. When at least one of the multi-planes completes programming of the highest state, the status report may indicate that the programming is passed. The status report may indicate that the programming is failed when the plurality of planes are all disabled before the highest state programming is completed. The status report may be sent to a host, or to a memory controller.

In the technical solution provided in the present disclosure, there is provided a method for programming a memory device, in which when a plurality of planes are programmed with a programming voltage incremented with a first step size, if the plane has been verified for a predetermined number of times, subsequent programming of the plane is prohibited. In subsequent programming, the step size of the programming voltage is reduced, and the plane that is not disabled is programmed with the programming voltage incremented with the second step size. In the implementation of the present disclosure, the programming interference in the multi-plane programming process can be reduced by disabling the plane in which the verification is failed, and when there is a plane in the plurality of planes that is disabled, the charging time and the holding time of the programming voltage are balanced by reducing the step size of the programming voltage.

Figure 5:
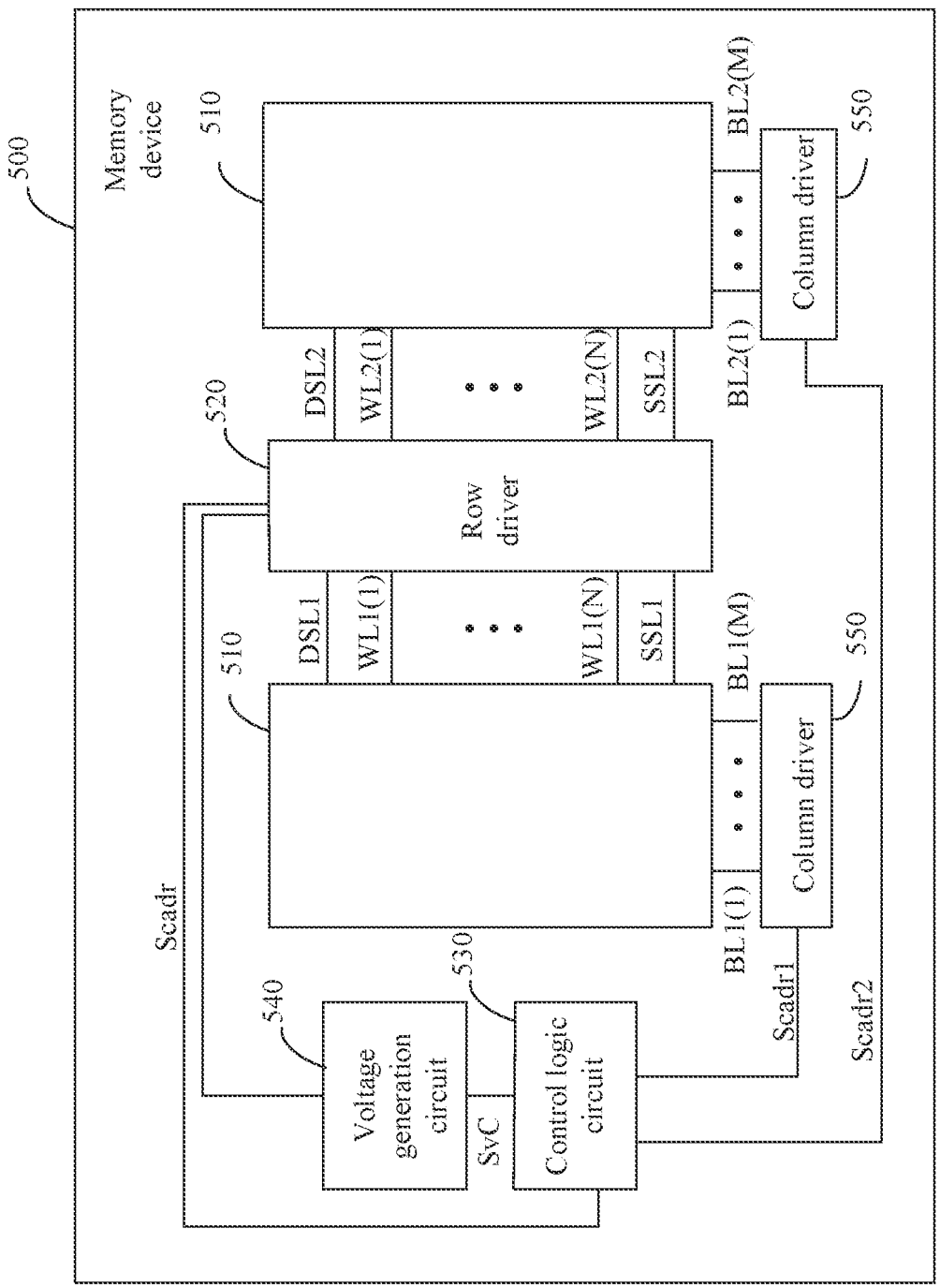
FIG. 5 is a schematic structural diagram of a memory device according to an implementation of the present disclosure.

Based on the same technical concept of the foregoing method for programming the memory device, an implementation of the present disclosure provides a memory device. FIG. 5 is a schematic structural diagram of a memory device according to an implementation of the present disclosure. As shown in FIG. 5, the memory device 500 includes:
- a memory array including a plurality of planes 510;
- a row driver 520, configured to apply a programming voltage incremented with a first step size to at least two of the plurality of planes; and
- a control logic circuit 530, configured to verify the at least two planes, and in response to determining that the at least two planes include a plane with a verification exception, disable the plane with the verification exception,
- the row driver 520 is further configured to, in response to the plane in the at least two planes being disabled, program a plane that is not disabled by using another programming voltage incremented with a second step size;
- where the second step size is less than the first step size.

It should be noted that FIG. 5 takes the memory device 500 having a dual-plane structure as an example for description. The memory device 500 may include a peripheral circuit. The peripheral circuit may include a control logic circuit 530, a voltage generation circuit 540, a row driver 520, and a column driver 550. Although a dual-plane structure is used in the implementation, it should be understood that other numbers of planes may be used within the scope of the present disclosure. When a multi-plane programming mode is employed, the planes 510 can be programmed simultaneously.

In some implementations, the memory device 500 includes a peripheral circuit and a memory array including a plurality of planes 510. The peripheral circuit is configured to apply a programming voltage incremented with a first step size to at least two of the plurality of planes; verify the at least two planes, and in response to determining that the at least two planes include a plane with a verification exception, disable the plane with the verification exception; and in response to a plane in the at least two planes being disabled, programme a plane that is not disabled by using another programming voltage incremented with a second step size, where the second step size is less than the first step size.

In practical application, the control logic circuit 530 may be coupled to the voltage generation circuit 540, the row driver 520, and the column driver 550. The voltage generation circuit 540 may be coupled to the row driver 520. The row driver 520 may be coupled to a plane 510 via a drain select line DSL1, word lines WL (1) to WL (N), and a string select line SSL1. N is a positive integer, e.g., N=128. The row driver 12 may be coupled to another plane 510 via a drain select line DSL2, word lines WL2 (1) to WL2 (N), and a string select line SSL2. The column driver 550 may be coupled to a plane 510 via bit lines BL1 (1) to BL1 (M). M is a positive integer, e.g., M=131072. The column driver 550 may be coupled to another plane 510 via bit lines BL2 (1) to BL2 (M). Each of the planes 510 may include a plurality of blocks, each block may include a plurality of pages, and each page may include a plurality of memory cells. Memory cells in plane 510 may be addressed by word lines WL1 (1) to WL1 (N) and bit lines BL1 (1) to BL1 (M), and memory cells in another plane 510 may be addressed by word lines WL2 (1) to WL2 (N) and bit lines BL2 (1) to BL2 (M).

The control logic circuit 530 may communicate with a host, or a memory controller, to receive data for storage in the plane 510 and to transmit data obtained from the plane 510. The control logic circuit 530 may receive commands, addresses, or data from a host or a memory controller and generate column address signals Scadr1, Scadr2, a row address signal Sradr, and a voltage control signal Svc. In response to the voltage control signal Svc from the control logic circuit 530, the voltage generation circuit 540 may generate a voltage for reading, programming, erasing, and verification operations. The voltage generated by the voltage generation circuit 540 may exceed the power supply voltage supplied to the memory device. The row driver 520 may operate in response to the row address signal Sradr from the control logic circuit 530 to select word lines for reading, programming, erasing, and verification operations. The column driver 550 may operate in response to column address signals Scadr1, Scadr2 from the control logic circuit 530 to generate bit line signals to select bit lines for reading, programming, erasing, and verification operations.

In an implementation of the present disclosure, the row driver 520 and the column driver 550 are coupled to all the plurality of planes 510 and controlled by the control logic circuit 530. The row driver is configured to apply a word line drive voltage to at least two planes on which programming operations are simultaneously performed in a multi-plane programming mode.

In a practical application, the control logic circuit 530 controls the voltage generation circuit to output an initial programming voltage/initial conduction voltage at a lower level, and controls the row driver to apply an initial programming voltage to a selected word line in the plane and an initial conduction voltage to an unselected word line.

In an implementation of the present disclosure, the second step size is determined according to the number of disabled plane.

In the implementation of the present disclosure, each of the planes 510 includes a plurality of memory cells arranged in rows and columns. The row driver 520 is specifically configured to apply the programming voltage incremented with the first step size to a plurality of selected memory cells in the at least two of the plurality of planes.

In an implementation of the present disclosure, the row driver 520 is further configured to apply a pass voltage incremented with a third step size to a plurality of unselected memory cells in the at least two of the plurality of planes.

In an implementation of the present disclosure, the row driver 520 is further configured to apply a pass voltage incremented with a fourth step size to a plurality of unselected memory cells in the plane that is not disabled, where the fourth step size is less than the third step size.

In the implementation of the present disclosure, the first step size is in a range of about 0.15 V to about 0.5 V, and the second step size is in a range of about 0.1 V to about 0.45 V.

In an implementation of the present disclosure, the control logic circuit 530 is specifically configured to verify each of the at least two planes to verify whether the plane reaches a predetermined programming state, and determine that the at least two planes include a plane with the verification exception, when the plane has been verified for a predetermined number of times and does not reach the predetermined programming state.

In an implementation of the present disclosure, the control logic circuit 530 is further configured to terminate programming of the at least two planes, when the at least two planes are disabled.

It should be noted that the foregoing description of the memory device is similar to the description of the above-described method implementation for programming the memory device, and has similar advantageous effects to those of the method implementation for programming the memory device. Therefore, details are not described. For technical details not disclosed in the memory device of the implementations of the present disclosure, please refer to the description of the method for programming the memory device of the implementations of the present disclosure.

Figure 6:
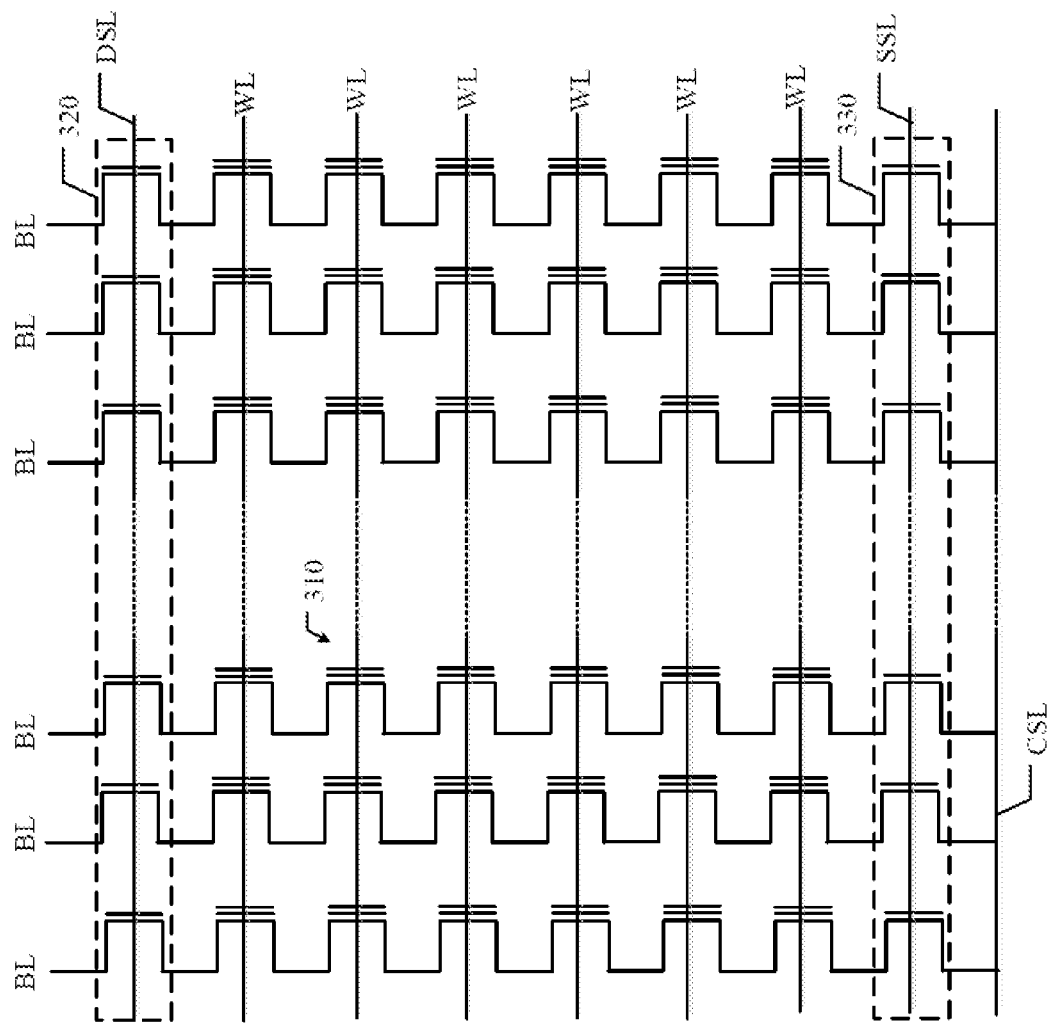
FIG. 6 is a schematic diagram of a memory cell array according to an implementation of the present disclosure.

FIG. 6 is a schematic diagram of a memory cell array according to an implementation of the present disclosure. Each plane may include a plurality of blocks. The memory cells in the memory cell array may be addressed by word lines WL and bit lines BL. As shown in FIG. 6, the memory cell array may include a plurality of memory cells 310, a string selection unit 320, and a ground selection unit 330. The memory cells 310 may be floating gate transistors or charge trapping transistors, and each of the memory cells 310, the string selection units 320, and the ground selection unit 330 may include a control terminal, a first terminal, and a second terminal. The drain selection line DSL may be coupled to the control terminal of the string selection unit 320, and the bit lines BLs may be coupled to the first terminal of the string selection unit 320 respectively. The memory cells 310 may be arranged in rows of memory cells coupled to the respective word lines WLs. The word lines WL may be coupled to the control terminals of the memory cells of the first row, the control terminals of the memory cells of the $N^{th}$ row respectively, and the first terminals of the memory cells 310 may be respectively coupled to the second terminal of the string selection unit 320. The string selection line SSL may be coupled to the control terminal of the ground selection unit 330, the first terminal of the ground selection unit 330 may be coupled to the second terminals of the memory cells 310 respectively, and the second terminal of the ground selection unit 330 may be coupled to a common source line CSL. The common source line CSL may provide a ground voltage.

An implementation of the present disclosure further provides a memory system, which includes the foregoing memory device, and a memory controller coupled to the memory device.

In some implementations, the memory device may specifically be a 3D NAND memory.

Specifically, the memory system may be a device having a memory device, such as an electronic computer, a smart phone, a smart television, a smart set top box, a smart router, an electronic digital camera, or an SSD. The memory system of the present disclosure generally further includes a controller, an input/output device, a display device, and the like. The memory device is configured to store files or data and be called by the controller. Specifically, the memory controller may write data to the memory device provided in the present disclosure, or may read data from the memory device provided in the present disclosure. The input/output device is configured to input instructions or output signals, and the display device visualizes the signals and implements various functions of the memory system.

The methods disclosed in the several method implementations provided herein may be arbitrarily combined without conflict to obtain new method implementations.

The features disclosed in the several device implementations provided herein can be arbitrarily combined without conflict to obtain new device implementations.

The foregoing description is merely specific implementations of the present disclosure, but the scope of protection of the present disclosure is not limited thereto. Any change or replacement readily contemplated by a person skilled in the art within the technical scope disclosed in the present disclosure shall fall within the scope of protection of the present disclosure. Accordingly, the scope of protection of the present disclosure shall be subject to the scope of protection of the claims.

What is claimed is:

1. A method for programming a memory device comprising planes, the method comprising:
    programming the planes by using a first programming voltage incremented with a first step size;
    verifying the planes, and in response to determining that one or more planes are with a verification exception, disabling the one or more planes with the verification exception; and
    in response to the one or more planes with the verification exception being disabled, programming remaining one or more planes that are not disabled by using a second programming voltage incremented with a second step size;
    wherein the second step size is determined according to a number of the one or more disabled planes and less than the first step size.

2. The method according to claim 1, wherein:
    the second step size is a second value when the number of the one or more disabled planes is a first value;
    the second step size is a fourth value when the number of the one or more disabled planes is a third value; and the third value is greater than the first value, and correspondingly, the fourth value is less than the second value.

3. The method according to claim 1, wherein each plane comprises a plurality of memory cells arranged in rows and columns, and programming the planes by using the first programming voltage incremented with the first step size comprises:
programming a plurality of selected memory cells in the planes by using the first programming voltage incremented with the first step size.

4. The method according to claim 3, further comprising:
applying a first pass voltage incremented with a third step size to a plurality of unselected memory cells in the planes, when programming the planes by using the first programming voltage incremented with the first step size.

5. The method according to claim 4, further comprising:
applying a second pass voltage incremented with a fourth step size to unselected memory cells in the one or more planes that is not disabled, when programming the one or more planes that is not disabled by using the second programming voltage incremented with the second step size,
wherein the fourth step size is less than the third step size.

6. The method according to claim 1, wherein:
the first step size is in a range of about 0.15 volt to about 0.5 volt; and
the second step size is in a range of about 0.1 volt to about 0.45 volt.

7. The method according to claim 1, wherein verifying the planes comprises:
verifying whether each plane reaches a predetermined programming state; and
in response to one plane being verified for a predetermined number of times without reaching the predetermined programming state, determining that the one plane is with the verification exception.

8. The method according to claim 1, further comprising:
terminating programming of the planes, when all planes are disabled.

9. A memory device, comprising:
a memory array comprising planes;
a row driver configured to apply voltages to the planes; and
a control logic circuit configured to:
control the row driver to apply a first programming voltage incremented with a first step size to program the planes,
verify the planes, and in response to determining that the one or more planes are with a verification exception, disable the one or more planes with the verification exception, and
in response to the one or more planes being disabled, control the row driver to apply a second programming voltage incremented with a second step size to further program remaining one or more planes that are not disabled,
wherein the second step size is determined according to a number of the one or more disabled planes and less than the first step size.

10. The memory device of claim 9, wherein:
the second step size is a second value when the number of the one or more disabled planes is a first value;
the second step size is a fourth value when the number of the one or more disabled planes is a third value; and
the third value is greater than the first value, and correspondingly, the fourth value is less than the second value.

11. The memory device of claim 9, wherein each plane comprises memory a plurality of cells arranged in rows and columns, and the control logic circuit is further configured to:
control the row driver to apply the first programming voltage incremented with the first step size to selected memory cells in the planes.

12. The memory device according to claim 11, wherein the control logic circuit is further configured to:
control the row driver to apply a first pass voltage incremented with a third step size to unselected memory cells in the planes, when applying the first programming voltage incremented with the first step size to selected memory cells in the planes.

13. The memory device according to claim 12, wherein the control logic circuit is further configured to
control the row driver to apply a second pass voltage incremented with a fourth step size to unselected memory cells in the one or more planes that are not disabled, and apply the second programming voltage incremented with the second step size to selected memory cells in the one or more planes that are not disabled,
wherein the fourth step size is less than the third step size.

14. The memory device according to claim 9, wherein:
the first step size is in a range of about 0.15 volt to about 1 volt; and
the second step size is in a range of about 0.1 volt to about 0.45 volt.

15. The memory device according to claim 9, wherein the control logic circuit is further configured to:
verify whether each plane reaches a predetermined programming state; and
in response to one plane being verified for a predetermined number of times without reaching the predetermined programming state, determine that the one plane is with the verification exception.

16. The memory device according to claim 9, wherein the control logic circuit is further configured to:
terminate programming of the planes, when all planes are disabled.

17. A memory system, comprising:
one or more memory devices; and
a memory controller coupled to the memory devices;
wherein each of the memory devices comprises:
a memory array comprising planes;
a row driver configured to apply voltages to the planes; and
a control logic circuit configured to:
control the row driver to apply a first programming voltage incremented with a first step size to program the planes,
verify the planes, and in response to determining that the one or more planes are with a verification exception, disable the one or more planes with the verification exception, and
in response to the one or more planes being disabled, control the row driver to apply a second programming voltage incremented with a second step size to further program remaining one or more planes that are not disabled,
wherein the second step size is determined according to a number of the one or more disabled planes and less than the first step size.

18. The memory system of claim 17, wherein:
the second step size is a second value when the number of the one or more disabled planes is a first value,
the second step size is a fourth value when the number of the one or more disabled planes is a third value;
wherein the third value is greater than the first value, and correspondingly, the fourth value is less than the second value.

19. The memory system of claim 17, wherein each plane comprises memory a plurality of cells arranged in rows and columns, and the control logic circuit is further configured to:
control the row driver to apply the first programming voltage incremented with the first step size to selected memory cells in the planes.

20. The memory system according to claim 19, wherein the control logic circuit is further configured to:
control the row driver to apply a first pass voltage incremented with a third step size to unselected memory cells in the planes, when applying the first programming voltage incremented with the first step size to selected memory cells in the planes.

\* \* \* \* \*